(12) United States Patent
Schuster (10) Patent No.: US 7,099,087 B2
(45) Date of Patent: Aug. 29, 2006

(54) CATADIOPTRIC PROJECTION OBJECTIVE

(75) Inventor: Karl-Heinz Schuster, Königsbronnzang (DE)

(73) Assignee: Carl Zeiss SMT AG, Oberkochen (DE)

( * ) Notice: Subject to any disclaimer, the term of this patent is extended or adjusted under 35 U.S.C. 154(b) by 759 days.

(21) Appl. No.: 10/114,919

(22) Filed: Apr. 3, 2002

(65) Prior Publication Data

US 2002/0167734 A1     Nov. 14, 2002

(30) Foreign Application Priority Data

Apr. 7, 2001   (DE) ................................. 101 17 481

(51) Int. Cl.
*G02B 27/14*   (2006.01)
*G02B 17/00*   (2006.01)

(52) U.S. Cl. ..................................... 359/629; 359/726

(58) Field of Classification Search ........ 359/726–736, 359/629
See application file for complete search history.

(56) References Cited

U.S. PATENT DOCUMENTS

| 4,302,079 | A |   | 11/1981 | White       | 350/371 |
| 4,896,952 | A |   | 1/1990  | Rosenbluth  | 350/445 |
| 5,636,066 | A |   | 6/1997  | Takahashi   | 359/726 |
| 5,691,802 | A |   | 11/1997 | Takahashi   | 355/53  |
| 5,771,125 | A | * | 6/1998  | Ishiyama    | 359/727 |
| 5,808,805 | A |   | 9/1998  | Takahashi   | 359/651 |
| 5,861,997 | A |   | 1/1999  | Takahashi   | 359/727 |
| 5,999,333 | A |   | 12/1999 | Takahashi   | 359/726 |
| 6,590,718 | B1 | * | 7/2003 | Furter et al. | 359/732 |

FOREIGN PATENT DOCUMENTS

| DE | 215179     | 10/1984 |
| DE | 4417489 A1 | 11/1995 |
| EP | 0350955 B1 | 11/1996 |
| EP | 0475020 B1 | 3/1997  |
| EP | 0602923 B1 | 10/1998 |

* cited by examiner

*Primary Examiner*—Scott J. Sugarman
(74) *Attorney, Agent, or Firm*—Ohlandt, Greeley, Ruggiero & Perle, L.L.P.

(57) ABSTRACT

There is provided a catadioptric projection objective that includes (a) an object plane having a rectangular object field, and (b) a beam splitter situated in a light path after the object plane, having a rectangular surface adapted to the object field and having an aspect ratio not equal to 1.

23 Claims, 4 Drawing Sheets

CATADIOPTRIC PROJECTION OBJECTIVE

CROSS-REFERENCE TO RELATED APPLICATIONS

The present application is claiming priority of German Patent Application serial No. 1001 17 481.0, which was filed on Apr. 7, 2001.

BACKGROUND OF THE INVENTION

1. Field of the Invention

The invention concerns a catadioptric projection objective with an object plane having a rectangular object field, a beam splitter, a concave mirror, an image plane, a first lens assembly, a second lens assembly, and a third lens assembly, where the first lens assembly is arranged between the object plane and the beam splitter. A preferred use of such a projection objective is the imaging of an object with light of a wavelength of $\leqq 258$ nm.

2. Description of the Prior Art

For projection exposure devices, with which patterns of photomasks or reticles, which are designated below in general as masks, are projected onto semiconductor wafers or glass substrates and exposed, optical projection systems of maximum resolution are used. In order to further reduce pattern width, which is substantially limited by resolution that is in turn limited by diffraction, preferably vacuum ultraviolet (VUV) rays with a wavelength of $\leqq 258$ nm are used for the smallest structures. A projection system for use in the deep UV region has become known from EP 0 475,020 A2.

The system shown in EP 0 475,020 A2 comprises at least a catadioptric system as well as a dioptric system. A mask to be imaged lies directly on a beam splitter, preferably a cube. A portion of light is reflected by the catadioptric system and deflected to the dioptric system by means of the beam splitter.

It is a disadvantage of the arrangement according to EP 0 475,020, that only intensity beam splitters are used on the one hand, and that, on the other hand, the object to be imaged is arranged directly on the beam splitter.

The use of intensity beam splitters has the disadvantage that only a fraction, for example, 25%, of the light passing through the mask reaches the object to be exposed, in the present case, the wafer.

A catadioptric projection system with intermediate image has become known from U.S. Pat. No. 5,636,066. Beam splitting is produced geometrically by means of a deflecting mirror. The deflecting mirror has an aperture or opening in its center and therefore serves as a diaphragm for a beam reflected from a catadioptric part at a concave mirror. The system according to U.S. Pat. No. 5,666,066 is constructed in such a way that an intermediate image is formed in a diaphragm plane of the deflecting mirror.

Another system with a geometric beam splitter, which is designed as a deflecting mirror, has become known from U.S. Pat. No. 5,691,802. A projection objective known from U.S. Pat. No. 5,691,802 also involves an intermediate image, wherein the intermediate image is formed in front of a catadioptric lens assembly in a region of a first lens assembly. It is a disadvantage in the system known from U.S. Pat. No. 5,691,802 that this arrangement necessarily involves an off-axis system due to the geometric beam splitting.

U.S. Pat. No. 4,302,079 involves a system with a polarizing optical beam splitter. A change of direction of polarization of a beam reflected by a concave mirror in a catadioptric lens assembly is provided by means of induced birefringence.

U.S. Pat. No. 4,896,952 shows a system with a polarizing optical beam splitter, wherein a change in direction of polarization is achieved in a catadioptric lens assembly by means of a $\lambda/4$ plate.

DD-C-215,179 also shows a system with a beam splitter. The beam splitter is formed as a partially transparent beam splitter cube. The system according to DD-C-215,179 has two identical mirrors at two of four sides of the beam splitter cube, which are perpendicular to a pre-given plane, as well as two dioptric subassemblies at the other two sides of the beam splitter cube. The dioptric subassemblies are designed such that a Petzval sum of the two systems extensively compensates that of the mirrors.

A catadioptric projection objective without intermediate image has become known from EP-A-0 350,955, in which a first lens group or a first lens assembly is provided between an object, i.e., a reticle, and a beam splitter; a second lens group is provided between the beam splitter and a concave mirror; and a third lens group is provided between the beam splitter and an image plane.

U.S. Pat. No. 5,808,805 and U.S. Pat. No. 5,999,333 show a catadioptric objective with an intermediate image and a beam splitter as well as at least two lens assemblies, whereby the lens assemblies are constructed in such a way that the intermediate image comes to lie in a vicinity of the beam splitter surface of the beam splitter. According to U.S. Pat. No. 5,808,805, a beam splitter, for example, a beam splitter cube, is used as the beam splitter. U.S. Pat. No. 5,999,333 shows a use of a mirror as a geometric beam splitter.

A disadvantage in the systems with geometric beam splitting is that this involves an off-axis system. Both the system known from U.S. Pat. No. 5,808,805 as well as the one known from U.S. Pat. No. 5,999,333 have a very large range of angles of incidence of back-reflecting beams from a concave mirror impinging on a surface of a beam splitter.

U.S. Pat. No. 5,861,997 shows a system similar to that of U.S. Pat. No. 5,808,805 and that of U.S. Pat. No. 5,999,333 with two intermediate images, wherein one intermediate image again comes to lie in a vicinity of a beam splitter, so that large angles of incidence occur at the beam splitter.

Due to the large range of angles of the radiation impinging on the beam splitter layer, quality of the image is reduced, since reflectivity and transmission of the beam splitter layer depend on an angle of incidence on the beam splitter layer, and different intensity distributions result with different angles of incidence.

In order to avoid this disadvantage, EP-A-0 602,923 proposes providing a lens in front of a beam splitter, by means of which radiation impinging on the beam splitter is made parallel.

A beam path that is made parallel is also realized in a catadioptric projection system known from U.S. Pat. No. 5,771,125. A disadvantage of the arrangement according to EPA-0 602,923 and that of U.S. Pat. No. 5,771,125 is that positive refractive power of a mirror in a catadioptric part is not compensated. This means that a beam that impinges on a beam splitter layer is parallel, but such is not so for a beam that is back-reflected after reflection at a concave mirror. In one direction, therefore, rays impinging onto the beam splitter layer have a large range of angles of incidence than do rays impinging from the other direction. This has the consequence that a pure splitting into polarization directions cannot be achieved. Double images and a loss of contrast are a result of this effect.

In order to minimize an angle of incidence on a beam splitter layer, DE-A-4,417,489 proposes to arrange at least one convergent lens that makes a light beam impinging onto the beam splitter layer parallel and a divergent lens group having a divergent lens after the beam splitter in a catadioptric lens assembly, in order to compensate for an effect of the convergent lens for making the beam impinging onto the beam splitter layer parallel. In addition, another convergent lens is provided on an image side after a beam splitter prism in order to compensate for an effect of the divergent lens group in a case of a beam reflecting back from a concave mirror in double passage.

SUMMARY OF THE INVENTION

An object of the present invention is thus to provide an arrangement with which the disadvantages of the state of the art are avoided. In particular, an arrangement will be provided that avoids a problem of a heating of a beam splitter due to beams impinging thereon.

According to the invention, this object is solved in that, a beam splitter is arranged near an object plane or a plane conjugated to the object plane, and the beam splitter is formed as a beam splitter prism, whose side surfaces have a cross section adapted to an object field as a rectangle with an aspect ratio not equal to 1.

Due to the arrangement of the beam splitter near the object plane or a plane conjugated to the object plane, the beam splitter can be formed in a shape of a split column. A column, as compared to a cube, has a relatively high ratio of surface area to total volume. A column-shaped beam splitter is advantageous because heat load per unit of volume is very high in the beam splitter, but, a path from an internal beam splitter layer to an exterior surface of the beam splitter can be short, and thus the heat can be dissipated very rapidly and efficiently over the outer surfaces of the beam splitter. In contrast, in a cube-shaped beam splitter, a path from an internal point to the surface of the beam splitter can be relatively long, and thus, does not dissipate heat as efficiently as the beam splitter of the present invention.

In order to minimize an angle of incidence on the beam splitter layer, a convergent lens or a convergent lens group can be arranged on the object side in front of the beam splitter, for making a light beam impinging on the beam splitter layer parallel.

In a preferred embodiment, the beam splitter is a physical beam splitter such as a polarization optical beam splitter. Such a polarizing optical beam splitter comprises a polarization-dependent reflecting layer system.

In order to use a layer system that is as thin as possible for the polarizing optical beam splitting, it is provided to arrange the beam splitter in such a way that the angle of incidence on the reflecting layer system corresponds substantially to the Brewster angle of the layer system for the respective wavelength of the illumination light source. As is well known, under the Brewster angle, light of a polarization direction perpendicular to a surface of two media with different refractive indices is totally reflected. The Brewster angle $\epsilon$ is defined by $\epsilon = \arctan n(2)/n(1)$, wherein $n(1)$ is the refractive index of the first media and $n(2)$ is the refractive index of the second media. In case of air $n(1)=1$ and the Brewster angle is $\epsilon = \arctan n(2)$. Additional background material can be found in Gerthsen, Kneser, Vogel, "Physik", Springer-Verlag, Berlin, Heidelberg, N.Y., 1982, pages 480–482] This is a particular advantage, since layer thicknesses need only be very thin for an arrangement at the Brewster angle, in order to assure total reflection, which in turn means that there is less heating of the beam splitter and thus less optical error, for example, due to heat expansion, etc.

In order to reduce the heating of the beam splitter due to radiation load, in an advantageous embodiment, cooling devices are arranged at the surfaces that are not required for the optics. These cooling devices very rapidly dissipate the heat, which essentially arises from absorptions in the splitter layer, and thus prevent a heat buildup in the beam splitter. In this way, geometric imaging in reflection can be kept stable. Also, stress-induced birefringence due to temperature gradients is avoided.

Preferably, the cooling devices are Peltier elements or air coolers. Also, other embodiments, for example water-cooled cooling devices, are possible.

For color correction, it is advantageously provided that the catadioptric lens assembly comprises negative lenses, at least in part.

In addition to the catadioptric projection objective, the invention also provides for a projection exposure arrangement with such a projection objective.

It is particularly preferred if the means for producing polarized light are arranged in a diaphragm plane of the illumination system of the projection exposure arrangement, whereby the diaphragm plane lies in a plane conjugated to the object plane.

In general, two embodiments of the projection exposure arrangement are contemplated. In a first embodiment, a means for producing polarized light in a diaphragm plane comprises a means for producing polarized light perpendicular to a plane of incidence.

Alternatively, it may be provided that the light is polarized parallel to the plane of incidence.

A $\lambda/4$ plate of the lowest order can be provided as the means for changing the polarization state in a second lens assembly of the catadioptric projection objective. It is assured thereby that despite a convergence in the beam path, a $\lambda/4$ effect will still be obtained in the catadioptric lens assembly. These $\lambda/4$ plates of the lowest order can be produced preferably from synthetic quartz crystal.

A preferred use of the projection objective according to the invention is imaging of mask patterns with deep UV light, preferably of a wavelength that is smaller than 258 nm. Preferably, laser light with a wavelength of 193, 157 and 126 nm is utilized for illumination.

The above-noted preferred use is not limiting, but should be understood as an example for possible applications of the device according to the invention.

The arrangement according to the invention is characterized by a small loss of intensity and a compact structural form. In comparison to other known catadioptric objectives, for example, objectives with mirror beam splitters, the system can be designed approximately one-third smaller when compared with known solutions. The applicability of catadioptric systems for deep UV lithography is considerably increased by the invention, particularly with a view toward even larger apertures.

BRIEF DESCRIPTION OF THE DRAWINGS

An example of the invention will be described below on the basis of the drawings.

Here.

DESCRIPTION OF THE INVENTION

Figure 1:
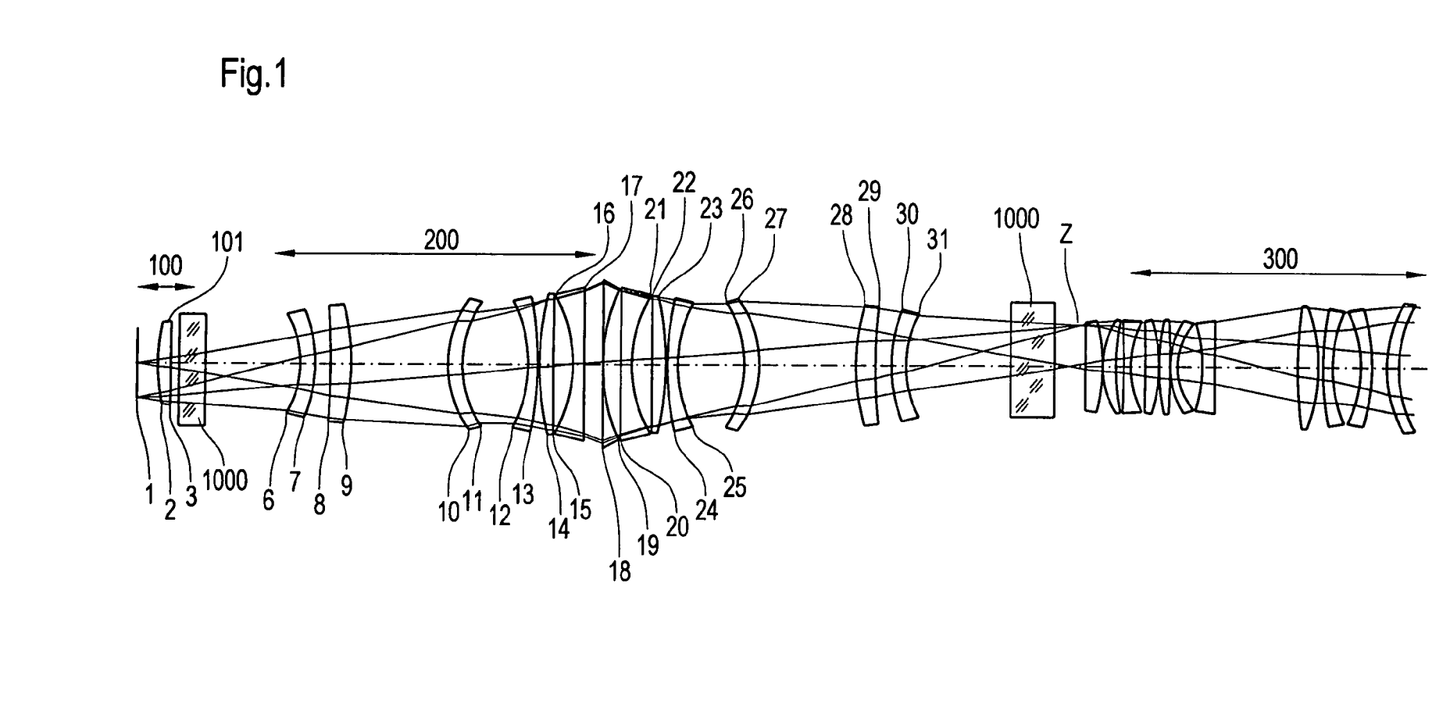
FIG. 1 is a schematic representation of a catadioptric projection objective in accordance with the present invention

FIG. 1 is a schematic representation of a catadioptric projection objective in accordance with the present invention. FIG. 1 is not pictorial representation of the projection objective, but instead shows a sequence of components, from left to right, in a light path through the projection objective. The principal components of the projection objective include a first lens assembly 100, a beam splitter 1000, a second lens assembly 200, a concave mirror surface 18, and a third lens assembly 300. The projection objective also includes an object plane 1 and an intermediate image Z.

First lens assembly 100 lies between object plane 1 and a first side of beam splitter 1000. An optical distance is a distance that light travels between two optical elements, and it is not necessarily the same as a physical distance between the two optical elements. The optical distance from object plane 1 to beam splitter 1000 is less than about ⅓, preferably less than about ¼, and most preferably less than about ⅕, of the optical distance between beam splitter 1000 and concave mirror surface 18. Intermediate image Z lies after a second side of beam splitter 1000.

Alternatively, beam splitter 1000 can be situated near a conjugate plane, where the conjugate plane is a plane conjugated to object plane 1. For example, such a conjugate plane is a plane in which intermediate image Z is formed. In this alternative embodiment, the optical distance, i.e., the distance of the light traveling through the system, from the conjugate plane to beam splitter 1000 is less than about ⅓, preferably less than about ¼, and most preferably less than about ⅕, of the optical distance between beam splitter 1000 and concave mirror surface 18.

Third lens assembly 300 is arranged next to intermediate image Z. Third lens assembly 300 is not shown fully in FIG. 1.

First lens assembly 100 comprises a convergent lens 101 with surfaces 2, 3. Second lens assembly 200 comprises six lenses 205, 210, 215, 220, 225 and 230, and has a reduction ratio of 1.0±0.2.

Note that beam splitter 1000 and each of lenses 205, 210, 215, 220, 225 and 230 is represented twice in FIG. 1. This is because, as will further explained below, light travels in a first direction through beam splitter 1000 and the six lenses, is reflected by concave mirror surface 18, and then travels in a second direction back through the six lenses and beam splitter 1000. The traveling of light in the first direction is regarded as a first passage, and the traveling of the light in the second direction is regarded as a second passage. Thus, light from object plane 1, during the first passage, travels in order through lenses 205, 210, 215, 220, 225 and 230, is reflected by concave mirror surface 18, and then during the second passage, travels in order through lenses 230, 225, 220, 215, 210 and 205.

Each of the lenses of second lens assembly 200 has two surfaces. In FIG. 1, each of the surfaces is shown with two reference numbers, i.e., a first number for referring to the surface during the first passage, and a second number for referring to the surface during the second passage. Thus, the sixes lenses of second lens assembly 200 are shown to have surfaces 6, 7, 8, 9, 10, 11, 12, 13, 14, 15, 16, 17 in the first passage, and surfaces 19, 20, 21, 22, 23, 24, 25, 26, 27, 28, 29, 30, 31 in the second passage.

Convergent lens 101 in first lens assembly 100 serves to make substantially parallel rays that are impinging thereon from object plane 1, so that in a region of a beam splitter layer (see FIG. 2, reference number 1016) of beam splitter 1000, only a small variation in the angle of incidence of the impinging rays is present.

The lenses in second lens assembly 200 provide a divergent effect that compensates for a collecting effect of the convergent lens 101, which lies in making parallel the radiation impinging on the beam splitter layer, and provides for a divergent beam bundle on concave mirror surface 18.

According to the invention, beam splitter 1000 is a polarizing optical beam splitter prism. Beam splitter 1000 has a rectangular columnar shape. That is, beam splitter 1000 has a rectangular two-dimensional cross-section, which is extended in a third dimension to form a column.

Beam splitter 1000 is situated near the object field of object plane 1, and has a side surface facing the object field. The side surface is adapted to the shape of the object field. That is, the shape of the side surface is substantially the same as the shape of the object field. More specifically, the object field is rectangular, and thus, the surface of beam splitter 1000 facing the object field is rectangular. Note however, that although the shapes are substantially the same, the size of the side surface is not necessarily the same as the size of the object field. In practice, the dimensions of the side surface are typically greater than the dimensions of the object field.

An aspect ratio is a ratio of a first dimension of a rectangle, e.g. height, to a second dimension of a rectangle, e.g. width. Since the shape of the side surface is substantially the same as the shape of the object field, the aspect ratio of the side surface is also substantially the same as the aspect ratio of the object field. In the present invention, the rectangular surface of the beam splitter has an aspect ratio that is not equal to 1.

Figure 4:
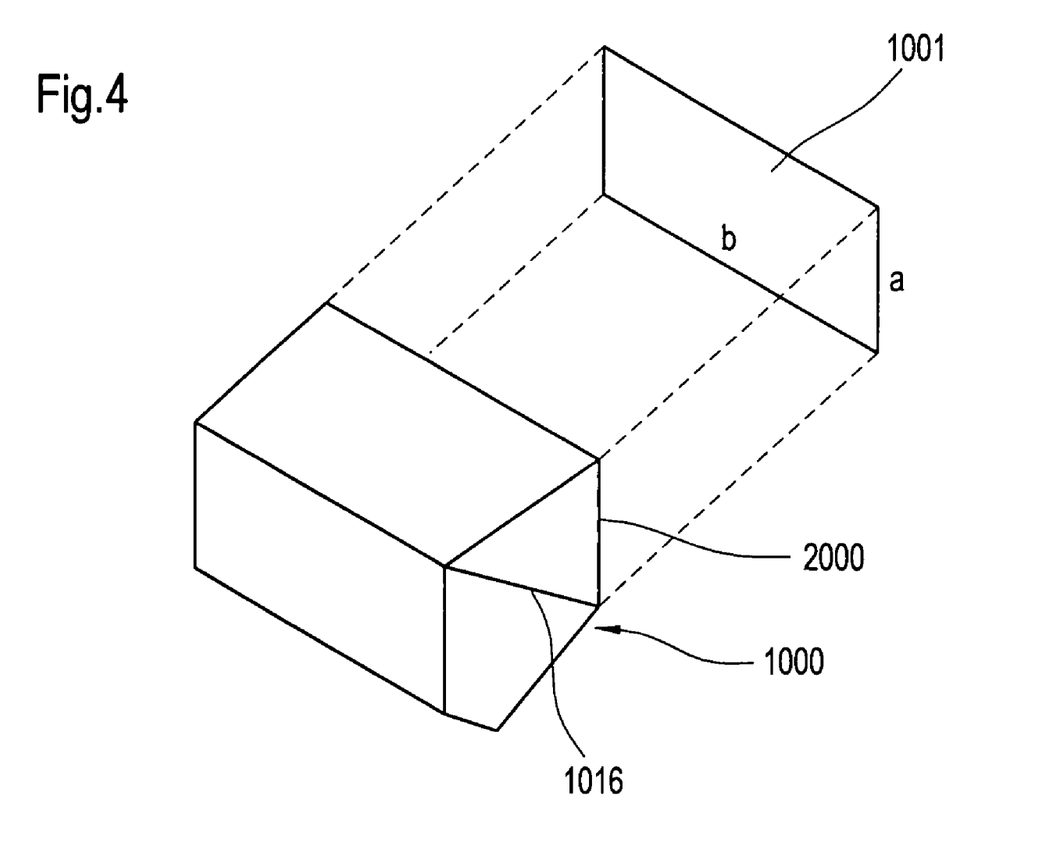
FIG. 4 is a perspective view of a beam splitter in accordance with the present invention.

FIG. 4 is a perspective view of beam splitter 1000 in principle. Polarizing beam splitter layer 1016 is also shown. An object field 1001 in the object plane 1 (see FIG. 1) has a rectangular shape with a width "a" and a height "b". Since "b" is not equal to "a", the aspect ratio of object field 1001 is not equal to one. A surface 2000 of beam splitter 1000 that faces object field 1001 is adapted to the shape of object field 1001. That is, the shape of surface 2000 is similar to the shape of object field 1001, and thus, surface 2000 is also rectangular with an aspect ratio that is not equal to 1. In practice, the dimensions of surface 2000 are typically greater than the dimensions of object field 1001.

Because beam splitter 1000 is in the form of a rectangular column, it has a short path for the heat propagating therethrough, and thus a short path for dissipating the heat. The heat may be regarded as a form of radiation traveling through beam splitter 1000.

Figure 2:
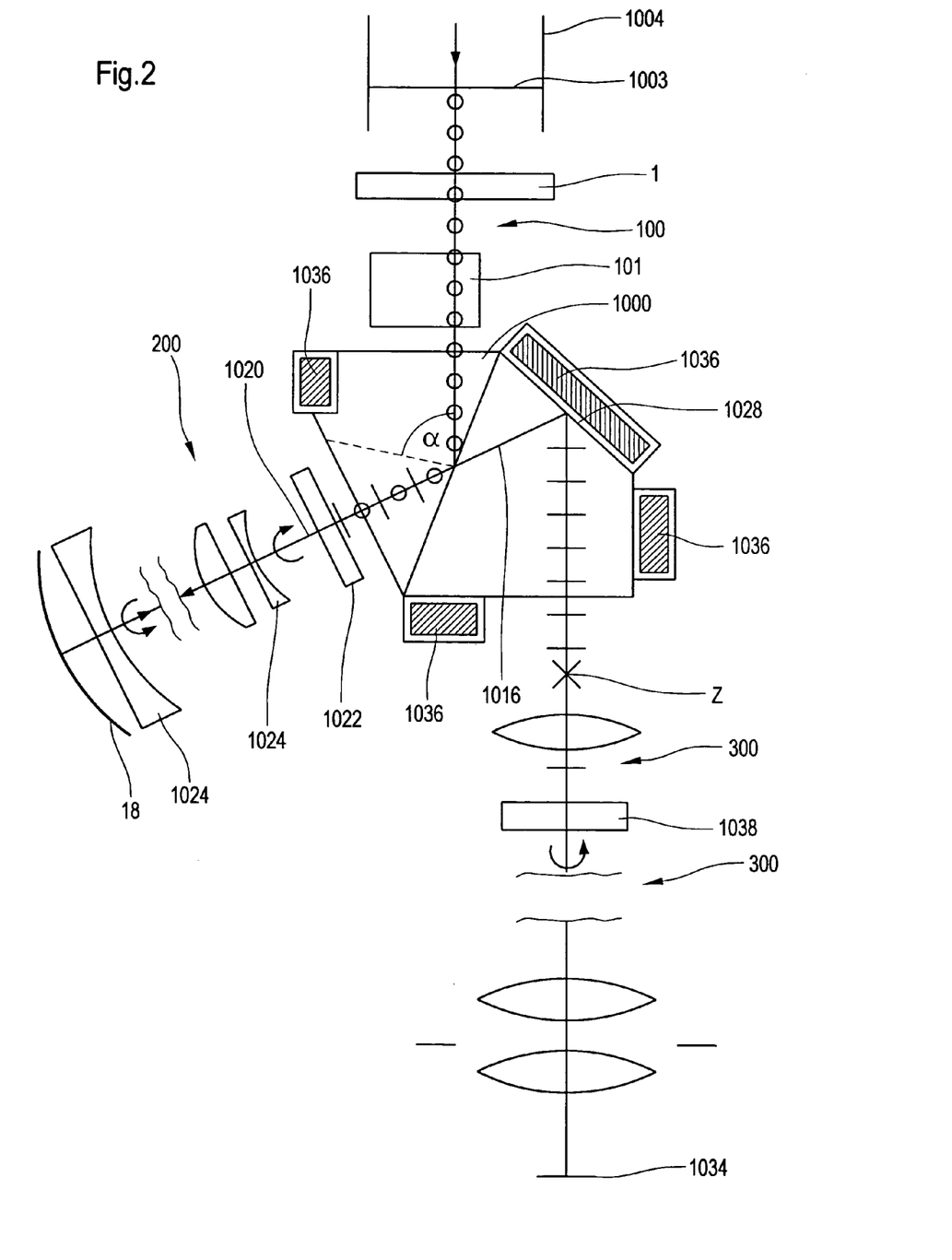
FIG. 2 is a schematic representation of an embodiment of a projection exposure device with a projection objective according to the invention, in which light striking on a reflecting layer of a beam splitter is polarized perpendicular to a plane of incidence.

FIG. 2 is a schematic representation of an embodiment of a projection exposure device with a projection objective according to the invention.

An object or reticle in object plane 1, which is to be imaged with a projection objective according to the invention in an image plane 1034, is illuminated with linear polarized light of illumination system 1004 of the projection exposure device. Means for producing polarized radiation are arranged in a diaphragm plane 1003 of illumination system 1004, which is conjugated to object plane 1.

Beam splitter 1000 includes a beam splitter layer 1016. Beam splitter layer 1016 is reflective, but such reflection is polarization-dependent. Polarized light that is linear and perpendicular to the plane of incidence of beam splitter layer 1016 is almost completely reflected at beam splitter layer 1016 into second lens assembly 200 of the projection objective according to the invention. Intensity losses that are as small as possible occur, if beam splitter 1000 is arranged in such a way that the linearly polarized light substantially impinges onto the beam splitter layer 1016 under the Brewster angle. The layer constructions or layer designs of beam splitter layer 1016, which may be one of a plurality of such layers, required for an almost complete reflection can then be made very thin, which is particularly advantageous with respect to a heating of beam splitter 1000. In addition, in a case where the angles of incidence of the rays onto the polarization layer vary slightly, a deposition layer varying continuously in thickness can compensate for the variations in the angles of incidence in order to avoid phase variations and minimize variations in brightness.

Light from illumination system 1004 is reflected at layer 1016 and thereafter impinges on a λ/4 plate 1022 behind beam splitter 1000. Passage of the light through λ/4 plate 1022 yields circularly polarized light 1020. Color errors are corrected by negative lenses 1024 in second lens assembly 200. Circularly polarized light 1020 impinges on concave mirror surface 18 and is reflected, substantially completely, and the direction of the circular polarization is changed by 180°, for example, from left to right rotation.

The reflected, circularly polarized light makes a second pass through λ/4 plate 1022 but in the opposite direction of the first pass. A change of polarization from being circularly polarized to linearly polarized is achieved thereby. The second passage of the light through λ/4 plate 1022 produces a linear polarization parallel to the plane of incidence on layer 1016. In this second pass, the linearly polarized light, due to its polarization, is not reflected by layer 1016, but instead, is transmitted through beam splitter 1000. A boundary layer 1028 of beam splitter 1000 reflects the light in the direction of third lens assembly 300.

An intermediate image Z lies just beyond beam splitter 1000 in the direction of third lens assembly 300. Due to the arrangement of beam splitter 1000 in the vicinity of or in object plane 1, beam splitter 1000 has a side surface with a cross section adapted to an object field in object plane 1 and thus beam splitter 1000 is in a form of a column. Because beam splitter 1000 is in the form of a column, heating of beam splitter 1000 due to radiation can be considerably reduced because heat can be more effectively dissipated from a column than from another shape, such as a cube. In order to support the heat dissipation from beam splitter 1000, in a preferred form of embodiment, it is also provided that cooling devices 1036 are arranged at those places of beam splitter 1000 that are not used for optical purposes. These cooling devices support the efficient heat dissipation from beam splitter 1000.

By introducing a second λ/4 plate 1038 in the third lens assembly 300, the light can again be circularly polarized. For example, fluctuations in the brightest intensity and asymmetries in the imaging can be reduced thereby. The material to be exposed, for example, the semiconductor wafer, is found in the image plane 1034.

Figure 3:
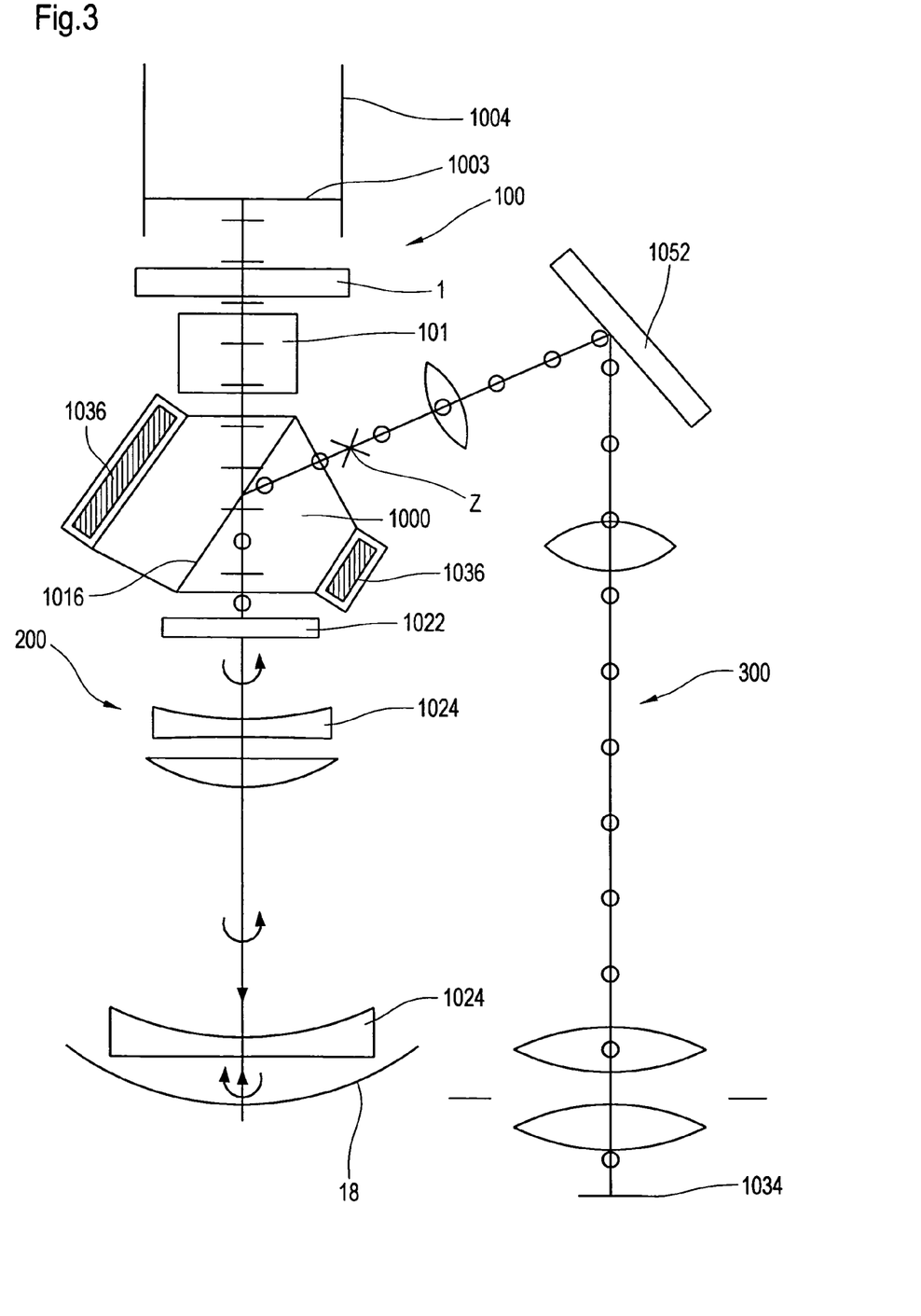
FIG. 3 shows an embodiment of the projection exposure arrangement, in which an incident light beam is polarized parallel to a plane of incidence of a reflecting layer.

FIG. 3 shows an alternative embodiment of the invention. An optical beam splitter is again utilized as the beam splitter, the reflecting layer 1016 of which is arranged such that incident light strikes at an angle coincidence to the Brewster angle. Where a component is shown in both FIG. 2 and FIG. 3, it is designated by the same reference number. In comparison to FIG. 2, the light in the diaphragm plane of the illumination system is polarized parallel to the plane of incidence. Correspondingly, it passes through the reflecting layer 1016 into the second lens assembly 200. Again, a λ/4 plate 1022 for reversing the polarization is arranged in the second lens assembly 200. The light reflected by concave mirror surface 18 of the catadioptric lens assembly is polarized perpendicular to the plane of incidence after another passage through λ/4 plate 1022 and is correspondingly completely reflected by layer 1016. Again, the beam splitter 1000 is arranged in the vicinity of intermediate image Z. In order to arrive at a compact structural form, a deflecting mirror 1052 can be provided in the third lens assembly 300.

Various materials can be used as the preferred material for the optical elements, such as lenses, beam splitters, etc., depending on the wavelength of the illumination source. For a wavelength of 193 nm, quartz glass is preferably used, which is characterized by a very low coefficient of expansion of only $0.5 \times 10^{-6}$, in addition to a high transmission at this wavelength. At a wavelength of 157 nm, $CaF_2$ is preferably used as the material for the optical components, while at a wavelength of 126 nm, a material, which is comprised at least partially of LiF, is used.

A projection objective that is characterized by a very efficient dissipation of heat is offered for the first time by the invention. The projection objective is particularly suited for use in a microlithography system, and can be employed for the production of microelectronic components.

Reference List
1 object plane
2, 3 surfaces in the first lens assembly
6, 7, 8, 9, 10, 11, 12, 13, 14, 15, 16, 17 surfaces in the second lens assembly in the first passage
18 concave mirror surface
19, 20, 21, 22, 23, 24, 25, 26, 27, 28, 29, 30, 31 surfaces in the second lens assembly in the second passage
100 first lens assembly
101 convergent lens
200 second lens assembly
300 third lens assembly
1000 beam splitter
1001 object field in the object plane
1003 diaphragm plane
1004 illumination system
1016 beam splitter layer
1020 light reflected in the beam splitter
1022 first λ/4 plate
1024 negative lenses
1028 boundary layer of the beam splitter
1034 image plane
1036 cooling device
1038 second λ/4 plate
1052 deflecting mirror
2000 side with a rectangular shape adapted to the shape of the object field of the beam splitter
Z intermediate image

The invention claimed is:
1. A catadioptric projection objective, comprising:
an object plane having an object field of a first rectangular shape; and
a beam splitter situated in a light path after said object plane, having a surface of a second rectangular shape adapted to said object field and having an aspect ratio not equal to 1, wherein said first rectangular shape is similar to said second rectangular shape.

2. The catadioptric projection objective of claim 1, wherein said beam splitter is a polarizing optical beam splitter.

3. The catadioptric projection objective of claim 1, further comprising:
a concave mirror surface situated such that light traveling from said beam splitter to said concave mirror surface is reflected by said concave mirror surface back to said beam splitter,
wherein said beam splitter is at an optical distance from said object plane that is less than about 1/3 of an optical distance between said beam splitter and said concave mirror surface.

4. The catadioptric projection objective of claim 1, further comprising:
a concave mirror surface situated such that light traveling from said beam splitter to said concave mirror surface is reflected by said concave mirror surface back to said beam splitter,
wherein said beam splitter is at an optical distance from a plane conjugated to said object plane that is less than about 1/3 of an optical distance between said beam splitter and said concave mirror surface.

5. The catadioptric projection objective of claim 1, further comprising a convergent lens situated between said object field and said beam splitter.

6. The catadioptric projection objective of claim 1, wherein said beam splitter comprises a polarization-dependent reflecting layer.

7. The catadioptric projection objective of claim 6, wherein polarized light is incident on said reflecting layer at an angle of about a Brewster angle of said reflecting layer.

8. The catadioptric projection objective of claim 6, further comprising a $\lambda/4$ plate situated in a light path before said beam splitter for changing a state of polarization of light.

9. The catadioptric projection objective of claim 6, further comprising a $\lambda/4$ plate situated in a light path after said beam splitter for changing a state of polarization of light.

10. The catadioptric projection objective of claim 1, further comprising a cooling device proximate to a surface of said beam splitter, for dissipating heat from said beam splitter.

11. The catadioptric projection objective of claim 1, further comprising a lens with negative refractive power in a light path after said beam splitter.

12. A projection exposure device for microlithography, comprising:
the catadioptric projection objective of claim 1; and
an illumination system having a light source for illuminating said object plane, wherein said illumination system has a diaphragm plane lying in a plane conjugated to said object plane.

13. The projection exposure device of claim 12, further comprising a $\lambda/4$ plate for producing polarized light, wherein said $\lambda/4$ plate is situated in said diaphragm plane.

14. A method for producing a microelectronic component, comprising using the projection exposure device of claim 12.

15. A catadioptric projection objective for imaging an object into an image plane, comprising:
an object plane with an object field of a first rectangular shape;
a first lens assembly;
a beam splitter;
a second lens assembly, said second lens assembly having a reduction ratio of 1.0±0.2;
a concave mirror; and
a third lens assembly,
wherein said beam splitter is formed as a prism having a surface of a second rectangular shape adapted to said object field and having an aspect ratio not equal to 1,
wherein said first rectangular shape is similar to said second rectangular shape,
wherein the object, when situated in said object plan, is illuminated by light,
wherein said light travels from said object plane through said first lens assembly to said beam splitter, and
wherein said light has a portion that travels from said beam splitter, through said second lens assembly in a first direction, is reflected by said concave mirror back through said second lens assembly in a second direction, to said beam splitter, and thereafter through said third lens assembly to the image plane.

16. The catadioptric projection objective of claim 15, wherein said beam splitter is at an optical distance from said object plane that is less than about 1/3 of an optical distance between said beam splitter and said concave mirror.

17. The catadioptric projection objective of claim 15, wherein said beam splitter is at an optical distance from a plane conjugated to said object plane that is less than about 1/3 of an optical distance between said beam splitter and said concave mirror.

18. A catadioptric projection objective, comprising:
an object plane having a rectangular object field;
a beam splitter situated in a light path after said object plane, having a rectangular surface adapted to said object field and having an aspect ratio not equal to 1; and
a concave mirror surface situated so that light traveling from said beam splitter to said concave mirror surface is reflected by said concave mirror surface back to said beam splitter,
wherein said beam splitter is at an optical distance from said object plane that is less than about 1/3 of an optical distance between said beam splitter and said concave mirror surface.

19. A catadioptric projection objective, comprising:
an object plane having a rectangular object field;
a beam splitter situated in a light path after said object plane, having a rectangular surface adapted to said object field and having an aspect ratio not equal to 1; and
a concave mirror surface situated such that light traveling from said beam splitter to said concave mirror surface is reflected by said concave mirror surface back to said beam splitter,
wherein said beam splitter is at an optical distance from a plane conjugated to said object plane that is less than about 1/3 of an optical distance between said beam splitter and said concave mirror surface.

20. A catadioptric projection objective, comprising:
an object plane having a rectangular object field;
a beam splitter situated in a light path after said object plane, having a rectangular surface adapted to said object field and having an aspect ratio not equal to 1; and
a cooling device proximate to a surface of said beam splitter, for dissipating heat from said beam splitter.

21. A projection exposure device for microlithography, comprising:

a catadioptric projection objective that includes:
(a) an object plane having a rectangular object field; and
(b) a beam splitter situated in a light path after said object plane, having a rectangular surface adapted to said object field and having an aspect ratio not equal to 1; and
an illumination system having a light source for illumination said object plane, and a diaphragm plane lying in a plane conjugated to said object plane.

22. A catadioptric projection objective for imaging an object into an image plane, comprising:
a object plane with a rectangular object field;
a first lens assembly;
a beam splitter;
a second lens assembly, said second lens assembly having a reduction ratio of $1.0\pm0.2$;
a concave mirror; and
a third lens assembly,
wherein said beam splitter is formed as a prism having a rectangular surface adapted to said object field and having an aspect ratio not equal to 1,
wherein the object, when situated in said object plane, is illuminated by light,
wherein said light travels from said object plane through said first lens assembly to said beam splitter,
wherein said light has a portion that travels from said beam splitter, through said second lens assembly in a first direction, is reflected by said concave mirror back through said second lens assembly in a second direction, to said beam splitter, and thereafter through said third lens assembly to the image plane, and
wherein said beam splitters at an optical distance from said object plane that is less than about $\frac{1}{3}$ of an optical distance between said beam splitter and said concave mirror.

23. A catadioptric projection objective for imaging an object into an image plane, comprising:
an object plane with a rectangular object field;
a first lens assembly;
a beam splitter;
a second lens assembly, said second lens assembly having a reduction ratio of $1.0\pm02$;
a concave mirror; and
a third lens assembly,
wherein said beam splitter is formed as a prism having a rectangular surface adapted to said object field and having an aspect ratio not equal to 1,
wherein the object, when situated in said object plane, is illuminated by light,
wherein said light travels from said object plane through said first lens assembly to said beam splitter,
wherein said light has a portion that travels from said beam splitter, through said second lens assembly in a first direction, is reflected by said concave mirror back through said second lens assembly in a second direction, to said beam splitter, and thereafter through said third lens assembly to the image plane, and
wherein said beam splitter is at an optical distance from a plane conjugated to said object plane that is less than about $\frac{1}{3}$ of an optical distance between said beam splitter and said concave mirror.

* * * * *